(12) United States Patent
Itabashi et al.

(10) Patent No.: US 6,816,377 B2
(45) Date of Patent: Nov. 9, 2004

(54) ELECTRONIC CONTROL UNIT

(75) Inventors: Toru Itabashi, Anjo (JP); Akinobu Makino, Hoi-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/393,258

(22) Filed: Mar. 21, 2003

(65) Prior Publication Data

US 2003/0184969 A1 Oct. 2, 2003

(30) Foreign Application Priority Data

Mar. 28, 2002 (JP) ......................................... 2002-092495

(51) Int. Cl.⁷ ................................................ H05K 7/20
(52) U.S. Cl. ..................... 361/704; 361/690; 361/719; 174/252
(58) Field of Search ................................. 361/690, 703, 361/704, 709, 719, 720; 257/706, 718, 719; 174/16.1, 16.3, 52.1; 165/80.3, 185

(56) References Cited

U.S. PATENT DOCUMENTS

| | | | | |
|---|---|---|---|---|
| 5,258,887 A | * | 11/1993 | Fortune | 361/720 |
| 5,467,251 A | * | 11/1995 | Katchmar | 361/719 |
| 6,002,587 A | * | 12/1999 | Shusa et al. | 361/704 |
| 6,025,991 A | | 2/2000 | Saito | |
| 6,058,013 A | * | 5/2000 | Christopher et al. | 361/704 |
| 6,084,776 A | * | 7/2000 | Cuntz et al. | 361/707 |
| 6,101,095 A | * | 8/2000 | Yamaguchi | 361/720 |
| 6,205,028 B1 | * | 3/2001 | Matsumura | 361/720 |
| 6,226,183 B1 | * | 5/2001 | Weber et al. | 361/704 |
| 6,434,006 B1 | * | 8/2002 | Fukatsu et al. | 361/704 |
| 6,498,726 B2 | * | 12/2002 | Fuller et al. | 361/704 |

FOREIGN PATENT DOCUMENTS

| | | | | |
|---|---|---|---|---|
| JP | U-H04-32566 | | 3/1992 | |
| JP | 04113695 A | * | 4/1992 | ........... H05K/7/20 |
| JP | H09-289381 | | 11/1997 | |
| JP | H11-345921 | | 12/1999 | |
| JP | 2001-57508 | | 2/2001 | |

* cited by examiner

Primary Examiner—Boris Chérvinsky
(74) Attorney, Agent, or Firm—Posz & Bethards, PLC

(57) ABSTRACT

An electronic control device having a high heat dissipating ability includes a printed board secured to an enclosure and interposed between a case and a cover with screws passing through the printed board. Thermally conductive thin film layers made of copper foil are formed in parallel on a mount face and an opposite mount face of the printed board and inside the printed board so as to be thermally separated from each other. A protrusion is provided on the cover and protrudes beyond a bottom part of the cover toward the position where an electronic component is mounted. A flexible, semi-solid thermally conductive material is placed between an end face of the protrusion and the opposite mount face of the printed board corresponding to the position where the electronic component is mounted to be in contact with the end face and the opposite mount face.

26 Claims, 13 Drawing Sheets

HEAT TRANSFER DIRECTION

HEAT TRANSFER DIRECTION

HEAT TRANSFER
DIRECTION

HEAT TRANSFER DIRECTION

ELECTRONIC CONTROL UNIT

CROSS REFERENCE TO RELATED APPLICATION

This application is based upon, claims the benefit of priority of, and incorporates by reference the contents of prior Japanese Patent Application No. 2002-92495 filed Mar. 28, 2002.

BACKGROUND OF THE INVENTION

1. Field of the Invention

The present invention relates to an electronic control unit which is placed in, for example, an engine compartment of a vehicle.

2. Description of the Related Art

In an electronic control unit (ECU), for example, used for control of a vehicle, a microcomputer for performing operational processing, an input/output circuit connected to an external load, a sensor, a power supply circuit for supplying power to circuits, and like components have been conventionally placed on a substrate. Then, these circuits and substrate are housed within an enclosure typically consisting of a case and a cover.

The electronic components constituting the above-mentioned circuits generate heat during their operation. An excessively increased temperature of the electronic components adversely affects the operation of the components. Therefore, in order to reduce a temperature of the electronic components, a method for transferring the heat to the substrate, and the like, so as to diffuse the heat is known.

Moreover, as shown in FIG. 12, for an electronic component (for example, a semiconductor chip of a power transistor) P1 that generates a particularly large amount of heat, a method using a radiator fin P2 or the like has been used to efficiently dissipate the heat generated from the electronic component P1 toward a case P3. However, given current product demands, the electronic control unit has been required to have higher function and performance levels, while the heat generated from the electronic component P1 increases.

Accordingly, in order to dissipate a larger amount of heat from the heat-generating electronic component P1, the structure as shown in FIG. 13 has been adopted. In this structure, a large piece of copper foil P6 is placed on the region where the electronic component P1 (more specifically, a heat sink P5) is attached on a substrate P4. The heat is dissipated via holes P7 to other larger pieces of copper foil P8 and the like. In this method, however, since an effective wiring area on the substrate P4 is decreased, the substrate P4 in a large size is accordingly required, leading to an increase in cost.

On the other hand, miniaturization of the electronic control unit is also desirable. In order to respond to such a need for miniaturization, that is, a method for miniaturizing the components in accordance with the development of semiconductor integration techniques, a method for making a number of circuits IC-compatible and the like have been used. However, the use of such methods causes an increase in temperature of the electronic component P1.

As measures against the increase in temperature of the electronic component P1, it has been proposed to use the expensive electronic component P1 which results in little power loss. Additionally, it has been proposed to mount the components on the radiator fin P2 or to increase the size of the substrate P4 to a certain degree so as to improve heat dissipation. However, these methods result in increased costs.

It is also conceivable to make the heat-generating electronic component P1 itself highly heat resistant. However, such a measure is not necessarily preferable because peripheral components placed at a high density also have an increased temperature due to heat transferred from the substrate P4, whereby the size of the substrate P4 must be increased to a certain degree or the peripheral components must be high heat-resistant components.

SUMMARY OF THE INVENTION

The present invention has been developed to solve the above problems, and has an object of providing an electronic control unit having a high heat dissipating ability, which can be easily fabricated at a low cost.

(1) A first aspect of the present invention relates to an electronic control unit. The unit includes a substrate having a mount face (i.e. first) and an opposite mount face (i.e. second), an electronic component that generates heat and is placed on a side of the mount face, and an enclosure consisting of a plurality of enclosure members to house the substrate. A portion of the enclosure members on a side of the opposite mount face is made to protrude toward a position where the electronic component is mounted, while a flexible, thermally conductive material is placed between the protrusion and the opposite mount face so as to be in contact with a side of the protrusion and the side of the opposite mount face. The enclosure member having the protrusion and the substrate are brought to be in direct contact with each other or in contact with each other through a spacer having a predetermined thickness so as to fix the assembly.

Since the flexible, thermally conductive material is provided between the protrusion of the enclosure member and the substrate in an embodiment of the present invention, it ensures close adherence between the enclosure member and the substrate on their large faces through the thermally conductive material. As a result, the heat dissipation properties are enhanced.

Moreover, since the enclosure member having the protrusion and the substrate are brought into direct contact with each other or through a spacer, the dimensional accuracy of a gap between the substrate and the protrusion can be ensured. As a result, since the thermally conductive member placed in the gap can be very small, such a structure contributes to a reduction in cost.

Moreover, even in the case where a thermally conductive material having an inferior thermal conductivity to those of the enclosure or a thermally conductive thin film layer (for example, a copper foil) on the surface of the substrate, the maximum heat dissipation properties can be ensured because the gap can be normally reduced as described above.

(2) According to a second aspect of the present invention, a thermally conductive thin film layer (for example, a piece of copper foil which is a thin, metallic film) having a higher thermal conductivity than that of a periphery thereof, is provided on the mount face so as to overlap a region obtained by projecting the electronic component thereon.

More specifically, the thermally conductive thin film layer is provided so as to (partially or entirely) overlap the region obtained by projecting the electronic component onto the substrate side, whereby the heat transfer properties from the electronic component side toward the substrate side can be enhanced. Although it is preferred that the sentence "the thermally conductive thin film layer is provided so as to (partially or entirely) overlap the region obtained by projecting" means "the thermally conductive thin film layer is provided on a half or more of the region obtained by projecting" in terms of heat transfer properties, it is more preferred that this sentence mean "the thermally conductive thin film layer is provided so as to completely include the region obtained by projecting." The same is applied to the following.

(3) According to a third aspect of the present invention, a thermally conductive thin film layer having a higher thermal conductivity than that of a periphery thereof is provided on the opposite mount face so as to overlap a region obtained by projecting an end face of the protrusion.

More specifically, the thermally conductive thin film layer is provided so as to (partially or entirely) overlap the region obtained by projecting the protrusion thereon, thereby enhancing the heat transfer properties from the substrate side toward the enclosure side.

(4) According to a fourth aspect of the present invention, thermally conductive thin film layers, each having a higher thermal conductivity than that of a periphery thereof, are provided respectively on the mount face and the opposite mount face so as to overlap a region obtained by projecting the electronic component thereon, and the thermally conductive thin film layers are connected to each other through a hole. Since the thermally conductive thin film layers provided on the mount face and the opposite mount face of the substrate are connected to each other through a hole In an embodiment of the present invention, the heat transfer properties between both surfaces of the substrate can be enhanced.

(5) According to a fifth aspect of the present invention, thermally conductive thin film layers, each having a higher thermal conductivity than that of a periphery thereof, are provided respectively on the mount face, the opposite mount face, and inside the substrate so as to overlap a region obtained by projecting the electronic component thereon.

Since the thermally conductive thin film layers are provided on the mount face and the opposite mount face of the substrate, and inside the substrate In an embodiment of the present invention, the heat transfer properties between both surfaces of the substrate can be enhanced.

(6) According to a sixth aspect of the present invention, an area of the thermally conductive thin film layer on the side of the opposite mount face is formed larger than that on the side of the mount face.

The present invention has advantages in that thermal conductivity can be further improved in a direction from the mount face of the substrate to its opposite mount face and in that the heat diffused to the periphery can be absorbed.

(7) According to a seventh aspect of the present invention, other than the thermally conductive thin film layer corresponding to the region obtained by projecting the electronic component, a thermally conductive thin film layer is provided at another location of the substrate, and the thermally conductive thin film layers are thermally separated from each other.

Since the thermally conductive thin film layers are thermally separated from each other In an embodiment of the present invention, the adverse heat diffusion to the peripheral components can be restrained.

(8) An eighth aspect of the present invention relates to an electronic control unit including a substrate having a mount face and an opposite mount face, an electronic component generating heat that is placed on a side of the mount face, and an enclosure housing the substrate. A part of the enclosure on the side of the mount face is made to protrude toward the electronic component, while a flexible, thermally conductive material is placed between the protrusion and the electronic component so as to be in contact with a side of the protrusion and a side of the electronic component.

In an embodiment of the present invention, the thermally conductive material is placed not on the side of the opposite mount face of the substrate, but on the mount face.

As a result, since the heat can be transferred from the electronic component toward the enclosure side through the thermally conductive material without passing through the substrate, good heat dissipation properties can be obtained so as to restrain the effects of heat on the other electronic components on the substrate. Moreover, the mounting area for wiring and the electronic components on the substrate can also be increased.

(9) According to a ninth aspect of the present invention, the electronic component is in contact with the thermally conductive material through a radiator member that is integrally molded with the electronic component. As a result, heat dissipation can be efficiently performed.

(10) A tenth aspect of the present invention relates to an electronic control unit including a substrate that has a mount face and an opposite mount face, an electronic component that generates heat and that is placed on a side of the mount face, and an enclosure that houses the substrate. A part of the enclosure on a side of the opposite mount face is made to protrude toward a position where the electronic component is mounted, while a flexible, thermally conductive material is placed between the protrusion and the opposite mount face, and at least one surface of the protrusion and the opposite mount face. At least one surface is in contact with the thermally conductive material and is formed to have a concave-convex shape.

More specifically, in an embodiment of the present invention, the flexible, thermally conductive material is placed between the protrusion of the enclosure and the opposite mount face of the substrate, while at least one of a surface of the protrusion and the opposite mount face is formed to have a convex-concave shape.

As a result, the contact area with the thermally conductive material is increased to improve the heat dissipation properties. Therefore, even in the case where an electronic component that generates a large amount of heat is to be mounted, another special structure (for example, an increase in size of the protrusion or the thermally conductive thin film layer) is not needed, thereby contributing to a reduction of the enclosure in terms of size or a reduction in cost.

(11) According to an eleventh aspect of the present invention, a thermally conductive thin film layer having a higher thermal conductivity than that of a periphery thereof is provided on the opposite mount face, while the convex portion of the convex-concave shape is provided on the thermally conductive thin film layer with solder. Since the convex portion is made of a solder in an embodiment of the present invention, the convex-concave shape can be easily formed at a low cost.

(12) According to a twelfth aspect of the present invention, the protrusion having the concave-convex shape is integrally formed with the enclosure. Since the protrusion and the concave-convex shape can be integrally formed by, for example, casting or injection molding, the concave-convex shape can be accurately formed even at a low cost. Moreover, since the dimensional accuracy of the gap between the protrusion and the substrate is enhanced, the minimal, yet thermally conductive material is sufficient for use. At the same time, the heat transfer performance can be maintained at a high level.

(13) According to a thirteenth aspect of the present invention, the convex portion and the concave portion on the opposite mount face are respectively formed so as to correspond to the convex portion and the concave portion on an end face of the protrusion. Since the gap between the protrusion and the substrate can be made uniform in an embodiment of the present invention, the heat transfer performance can be maximized. Moreover, the stress due to thermal expansion can also be made uniform. Furthermore, the minimal thermally conductive material is sufficient for use, while the heat transfer performance can be maintained at a high level.

(14) According to a fourteenth aspect of the present invention, thermally conductive thin film layers, each having a higher thermal conductivity than that of a periphery thereof, are provided on the mount face and the opposite mount face so as to overlap a region obtained by projecting the electronic component thereon, and the thermally conductive thin film layers are connected to each other via a hole. This structure allows the heat transfer properties to be enhanced as described above.

(15) According to a fifteenth aspect of the present invention, thermally conductive thin film layers, each having a higher thermal conductivity than that of a periphery thereof, are provided on the mount face and the opposite mount face and inside the substrate so as to overlap a region obtained by projecting the electronic component thereon. This structure allows the heat transfer properties to be enhanced as described above.

(16) According to a sixteenth aspect of the present invention, other than the thermally conductive thin film layer corresponding to the region obtained by projecting the electronic component, a thermally conductive thin film layer is provided at another location of the substrate, and the thermally conductive thin film layers are thermally separated from each other. This structure prevents the heat from being transferred to the peripheral electronic components and the like, as described above.

(17) A seventeenth aspect of the present invention relates to an electronic control unit including a substrate having a mount face and an opposite mount face, an electronic component that generates heat and that is placed on a side of the mount face and an enclosure housing the substrate. A solid thermally conductive member is placed between the opposite mount face and the enclosure so as to be in contact with a side of the opposite mount face and a side of the enclosure, while a flexible, thermally conductive material is placed between the thermally conductive member and the enclosure so as to be in contact with a side of the thermally conductive member and the side of the enclosure. Since the enclosure, the thermally conductive material, the thermally conductive member, and the substrate are placed in this order, high heat dissipation properties can be ensured.

Moreover, since it is not necessary to provide a protrusion on the enclosure side in advance, the common enclosure can be utilized. Furthermore, even if there is a change in layout of the electronic components and the like, it is not necessary to redesign the enclosure. Thus, such a structure is advantageous with its high general-purpose properties.

(18) According to an eighteenth aspect of the present invention, the thermally conductive member is soldered to the opposite mount face. As a result, heat transfer performance can be ensured. Moreover, in the case where, for example, a ceramic chip and the like is used as the thermally conductive member, the thermally conductive member can be attached to the substrate by a so-called surface mounting technique in the same manner as for the electronic components.

(19) According to a nineteenth aspect of the present invention, at least one surface of the thermally conductive member and the enclosure, the at least one surface being in contact with the thermally conductive material, is formed to have a convex-concave shape. The concave-convex shape increases the contact area with the thermally conductive material as described above, thereby improving the heat dissipation properties.

(20) According to a twentieth aspect of the present invention, the convex-concave shape of the enclosure is integrally formed with the enclosure. As described above, the integral formation allows the concave-convex shape to be accurately fabricated at low cost. Moreover, since dimensional accuracy of the gap between the thermally conductive member and the enclosure is increased, the area used by the thermally conductive member is minimized, while the heat transfer performance may be maintained at a high level.

(21) According to a twenty-first aspect of the present invention, the convex-concave shape of the thermally conductive member is integrally formed with the thermally conductive member. The present invention has the same effect as that of the above-described twentieth aspect.

(22) According to a twenty-second aspect of the present invention, the convex portion and the concave portion of the enclosure are respectively formed so as to correspond to the convex portion and the concave portion of the thermally conductive member.

Since a gap between the thermally conductive member and the enclosure can be made uniform in an embodiment of the present invention, the heat transfer performance can be maximized. Moreover, stress due to thermal expansion can be made uniform.

Furthermore, the minimal amount of thermally conductive material is sufficient for use, while the heat transfer performance can be maintained at a high level.

(23) A twenty-third aspect of the present invention relates to an electronic control unit including a substrate having a mount face and an opposite mount face, an electronic component that generates heat that is placed on a side of the mount face, and an enclosure that houses the substrate. A flexible, thermally conductive material is placed between a part of the enclosure on the side of the mount face and the electronic component so as to be in contact with a side of the enclosure and a side of the electronic component, while a surface of the side of the enclosure in contact with the thermally conductive material is formed to have a convex-concave shape.

Since the heat is transferred from the electronic component side toward the enclosure side through the thermally conductive material without passing through the substrate in an embodiment of the present invention, high heat dissipation properties can be obtained. Moreover, the effect of heat on the peripheral electronic components on the substrate can be prevented. Furthermore, since the convex-concave shape is formed on the enclosure side, the contact area is large, which in turn provides excellent heat dissipation properties.

(24) According to a twenty-fourth aspect of the present invention, the convex-concave shape is integrally formed with the enclosure. As described above, the integral formation allows the concave-convex shape to be accurately fabricated at a low cost. Moreover, since dimensional accuracy of the gap between the thermally conductive material and the enclosure is increased, the thermally conductive material that is used is minimized, while the heat transfer performance is maintained at a high level.

(25) According to a twenty-fifth aspect of the present invention, the electronic component is in contact with the thermally conducive material through a radiator member (for example, a heat sink) that is integrally molded with the electronic component. Since the electronic component radiates heat through the radiator member In an embodiment of the present invention, high heat dissipation properties can be obtained.

(26) A twenty-sixth aspect of the present invention relates to an electronic control unit including a substrate having a mount face and an opposite mount face, an electronic component that generates heat and that is placed on a side of the mount face, and an enclosure that houses the substrate. A part of the enclosure on a side of the opposite mount face is made to protrude toward a position where the electronic component is mounted, while a flexible, thermally conductive material is placed between the protrusion and the opposite mount face so as to be in contact with a side of the protrusion and the side of the opposite mount face. A movement-stopping part protruding toward a side of the thermally conductive material, for preventing the thermally conductive material from moving, is provided on at least one surface of the protrusion and the opposite mount face, the at least one surface being in contact with the thermally conductive material.

Since the movement-stopping part for preventing the thermally conducive material from moving, which is placed on the surface side of the protrusion, is provided In an embodiment of the present invention, the thermally conductive material does not fall out from a space between the protrusion and the substrate. For example, in the case where the thermally conductive material has a low flexibility, for example, in a sheet-like shape, it is suitable to provide convex portions at a plurality of locations in the periphery of the thermally conducive material and at the thermally conductive material itself. On the other hand, in the case where the thermally conductive material has a high flexibility, it is suitable to provide a frame-like convex portion which continuously surrounds the periphery of the thermally conductive material.

(27) According to a twenty-seventh aspect of the present invention, a thermally conductive thin film layer having a higher thermal conductivity than that of a periphery thereof is provided on the opposite mount face of the substrate corresponding to the position where the electronic component is mounted, while the movement-stopping part is provided on a surface of the thermally conductive thin film layer with a solder. In an embodiment of the present invention, for example, a frame-like movement-stopping part can be easily provided at a low cost, without requiring any processing or other components.

(28) According to a twenty-eighth aspect of the present invention, the movement-stopping part is integrally formed with the protrusion. The integral formation facilitates the formation of the movement-stopping part and improves the dimensional accuracy.

(29) A twenty-ninth aspect of the present invention relates to an electronic control unit including a substrate having a mount face and an opposite mount face, an electronic component that generates heat and is placed on a side of the mount face, and an enclosure that houses the substrate. A solid, thermally conductive member is placed between the opposite mount face and the enclosure so as to be in contact with a side of the opposite mount face and a side of the enclosure, while a flexible, thermally conductive material is placed between the thermally conductive member and the enclosure so as to be in contact with a side of the thermally conductive member and the side of the enclosure. A movement-stopping part protruding toward a side of the thermally conductive material, for preventing the thermally conductive material from moving, is provided on at least one surface of the opposite mount face and the thermally conductive member. The at least one surface being in contact with the thermally conductive material.

In an embodiment of the present invention, the thermally conductive member is placed between the opposite mount face and the enclosure, while the thermally conductive material is placed between the thermally conductive member and the enclosure. Moreover, the movement-stopping part is provided on the surface facing the thermally conductive material in contact therewith.

As a result, high heat dissipation properties can be ensured. In the case where the movement-stopping part is provided on the thermally conductive member side, in particular, standardization of the enclosure can be ensured. At the same time, the degree of freedom in substrate designing is improved, thereby largely contributing to a reduction in cost.

(30) According to a thirtieth aspect of the present invention, the movement-stopping part is integrally formed with the thermally conductive member or the enclosure. The integral formation facilitates the formation of the movement-stopping part and improves the dimensional accuracy.

(31) According to a thirty-first aspect of the present invention, the thermally conductive member is soldered onto the opposite mount face.

As a result, the heat transfer performance can be sufficiently ensured. In the case where, for example, a ceramic chip and the like is used as the thermally conductive member, the thermally conductive member can be attached to the substrate by a so-called surface mounting technique in the same manner as the electronic components.

(32) According to a thirty-second aspect of the present invention, thermally conductive thin film layers, each having a higher thermal conductivity than that of a periphery thereof, are respectively provided on the mount face and the opposite face so as to overlap a region obtained by projecting the electronic component thereon, while the thermally conductive thin film layers are connected to each other through a hole.

As a result, the heat transfer properties related to a thickness direction of the substrate can be enhanced, as described above.

(33) According to a thirty-third aspect of the present invention, thermally conductive thin film layers, each having a higher thermal conductivity than that of a periphery thereof, are respectively provided on the mount face, the opposite face, and inside the substrate so as to overlap a region obtained by projecting the electronic component thereon.

As a result, the heat transfer properties related to a thickness direction of the substrate can be enhanced, as described above.

(34) According to a thirty-fourth aspect of the present invention, other than the thermally conductive thin film layer corresponding to the region obtained by projecting the electronic component thereon, a thermally conductive thin film layer is provided at another location of the substrate, while the thermally conductive thin film layers are thermally separated from each other.

Since the thermally conductive thin film layers are thermally separated from each other, the effect of heat on the electronic components and the like at the periphery of the substrate can be restrained.

(35) A thirty-fifth aspect of the present invention relates to an electronic control unit including a substrate having a mount face and an opposite mount face, an electronic component that generates heat and that is placed on a side of the mount face, and an enclosure housing the substrate. A flexible, thermally conductive material is placed between a part of the enclosure on the side of the mount face and the electronic component so as to be in contact with a side of the enclosure and a side of the electronic component. A movement-stopping part protruding toward a side of the thermally conductive material, for preventing the thermally conductive material from moving, is provided on at least one surface of the electronic component and the enclosure, the at least one surface being in contact with the thermally conductive material.

Since the heat is transferred from the electronic component toward the enclosure side through the thermally conductive material and not through the substrate, little heat is transferred to the substrate side, thereby providing high heat dissipation properties. Moreover, thermal effects on the other components mounted on the substrate can be reduced. Furthermore, the movement-stopping part can prevent the thermally conductive material from flowing out.

(36) According to a thirty-sixth aspect of the present invention, the movement-stopping part is integrally formed with the enclosure. Since the movement-stopping part is integrally formed with the enclosure, its formation is simple. At the same time, high dimensional accuracy is obtained.

(37) According to a thirty-seventh aspect of the present invention, the electronic component is in contact with the thermally conductive material through a radiator member (for example, a heat sink) integrally molded with the electronic component. As a result, since the electronic components can radiate heat through the radiator member, the present invention is effective because of its high heat dissipation properties.

(38) According to a thirty-eighth aspect of the present invention, the movement-stopping part is a frame part surrounding a periphery of the thermally conductive material, formed in a convex shape. Since the-present invention prevents the thermally conductive material from flowing out or falling out, the thermally conductive material can be prevented from flowing out even if, for example, the electronic control unit is placed in a longitudinal direction.

Moreover, since the periphery of the position where the thermally conductive material is placed is surrounded by the frame part, it is not necessary to thinly apply the thermally conductive material thereto. The thermally conductive material has an even thickness by merely placing the thermally conductive material within the frame with a simple process (for example, potting the thermally conductive material in a mountainous shape).

A metal material having a higher thermal conductivity than, for example, that of a resin such as an epoxy resin serving as a substrate material and the like can be used as the solid thermally conductive member described above. In view of the thermal conductivity, a general alloy or metal material having a thermal conductivity of 20 to 400 W/m·K can be used.

The thermally conductive material is, for example, a flexible semi-solid (or a gel) whose shape is easily deformed upon pressing. A silicon-type material having a higher thermal conductivity than, for example, that of a resin such as an epoxy resin serving as a substrate material is used as the thermally conductive material. In view of the thermal conductivity, a material having a thermal conductivity of about 1 to 3 W/m·K can be used.

A thin film layer made of, for example, a copper foil having a higher thermal conductivity than that of a resin such as an epoxy resin that serves as a substrate material can be used as the thermally conductive thin film layer described above. In view of the thermal conductivity, copper having a thermal conductivity of about 398 W/m·K can be used.

A solid metal material, for example, having a higher thermal conductivity than that of a resin that serves as a molding material can be used as the radiator member (for example, a heat sink). In view of the thermal conductivity, a general alloy or metal material having a thermal conductivity of 20 to 400 W/m·K can be used.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Hereinafter, exemplary embodiments of an electronic control unit of the present invention will be described. The following description of the exemplary embodiments is merely exemplary in nature and is in no way intended to limit the invention, its application, or uses.

Figure 1:
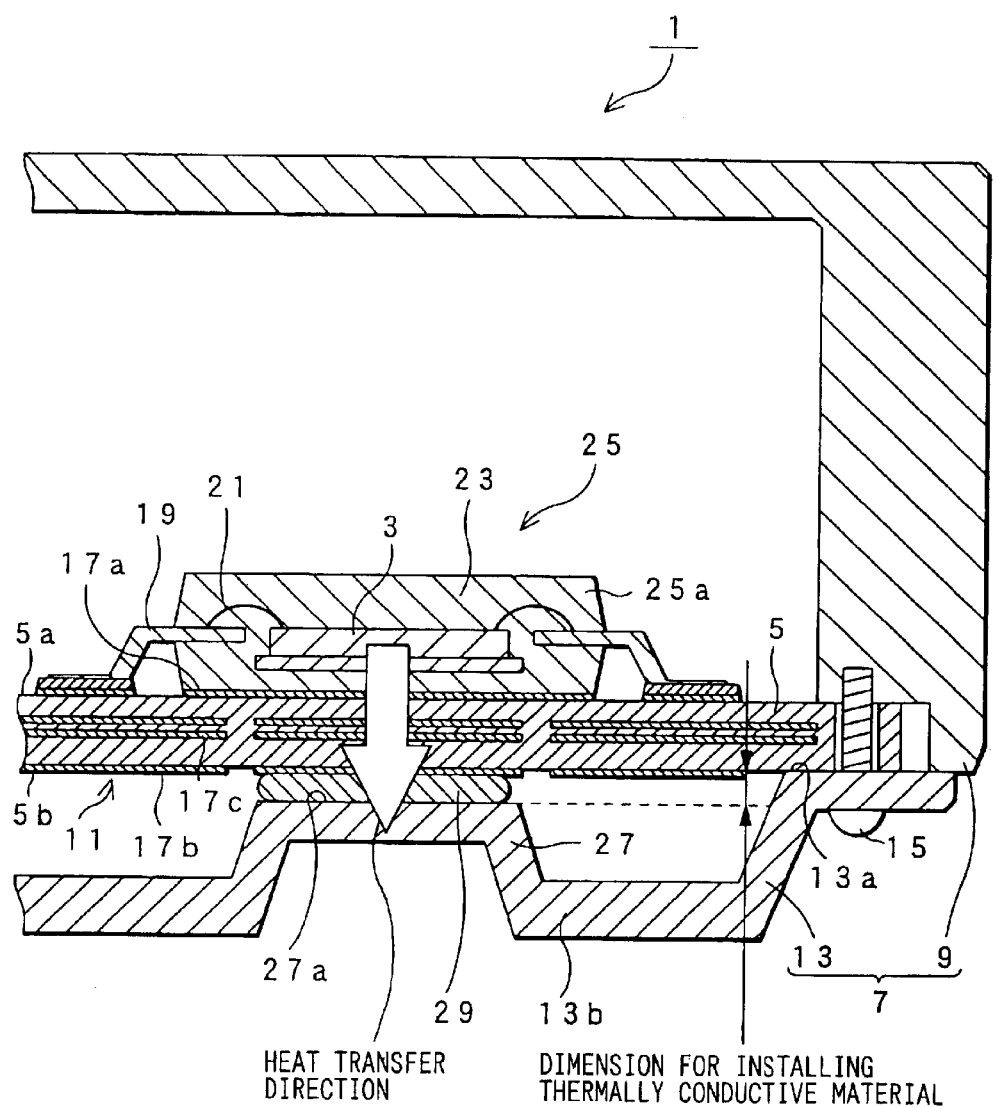
FIG. 1 is a cross-sectional view showing an electronic control unit of Embodiment 1.

(Embodiment 1)

a) First, an electronic control unit of Embodiment 1 will be described with reference to FIG. 1. As shown in FIG. 1, an electronic control unit (ECU) 1 in Embodiment 1 includes a printed board 5 on which a heat-generating electronic component (for example, a semiconductor chip) 3 is mounted, and an enclosure 7 that houses the printed board 5 therein.

The enclosure 7 is made of, for example, a metal such as aluminum or the like. The enclosure 7 is constructed, for example, by an approximately rectangular box-shaped case 9 and an approximately rectangular plate-like cover 13. The case 9 has an open end on one side (the lower side in FIG. 1). The cover 13 for closing the open side (opening 11) of the case 9 has a recession with a small depth. The case 9 and the cover 13 are connected to each other at their four corners through screws 15.

In connection between the case 9 and the cover 13, the printed board 5 is secured to the enclosure 7 by the screws 15 that pass through the printed board 5 while being interposed between the case 9 and the cover 13. Therefore, an opposite mount face 5b of the printed board 5 on the cover 13 side (a face opposed to a mount face 5a on which the electronic component 3 is mounted) and a connection face 13a provided at the outer periphery of the cover 13 are positioned on the same plane.

The printed board 5 is made of, for example, a resin material such as epoxy resin. A plurality of thermally conductive thin film layers 17a, 17b and 17c (collectively designated by the reference numeral 17) are formed in parallel on the mount face 5a and the opposite mount face 5b and inside the printed board 5, respectively. Each of the thermally conductive thin film layers 17a to 17c is made of a copper foil.

More specifically, on the mount face 5a and the opposite mount face 5b and inside the printed board 5, the thermally conductive thin film layers 17a, 17b, and 17c formed on the respective planes are separated from each other in a vertical direction in FIG. 1 as well as in a horizontal direction thereof. Therefore, the thermally conductive thin film layers 17a, 17b, and 17c are also thermally separated from each other.

The electronic component 3 is molded along with a lead frame 19 and a bonding wire 21 through a resin 23. The molded electronic component 3 (hereinafter, also referred to as a molded component 25) has a main body part 25a which is adhered to the thermally conductive thin film layer 17a formed on the mount face 5a of the printed board 5 through an adhesive. The lead frame 19 is soldered onto another thermally conductive thin film layer 17a on the mount face 5a.

The thermally conductive thin film layers 17 are formed so as to overlap a region obtained by projecting the electronic component 3 onto the printed board 5 side (that is, so as to be larger than a projected region). Among them, the thermally conductive thin film layer 17a has the same shape as the lower end face of the main body part 25a of the molded component 25, whereas the thermally conductive thin film layers 17b and 17c have substantially the same shape as that obtained by projecting the electronic component 3 onto the printed board 5.

The cover 13 has a protrusion 27 in an approximately trapezoidal shape. The protrusion 27 projects beyond a bottom portion 13b of the cover 13 toward the position where the electronic component 3 is mounted. An end face 27a of the protrusion 27 is formed flat so as to be parallel to the opposite mount face 5b of the printed board 5. Since the cover 13 is formed, for example, by pressing, a bottom side of the protrusion 27 is concave so as to correspond to the shape of the protrusion 27.

In this Embodiment 1, in particular, a flexible semi-solid thermally conductive material 29 is placed between the end face 27a of the protrusion 27 and the opposite mount face 5b of the printed board 5 corresponding to the position where the electronic component 3 is mounted (that is, a region obtained by projecting the electronic component 3 thereon) so as to be in contact with the end face 27a and the opposite mount face 5b. The thermally conductive material 29 is made of, for example, a silicon type gel resin material containing a metal filler.

The thermally conductive thin film layer 17b having a similar shape to that of the region obtained by projecting the electronic component 3 thereon is formed on a part of the surface of the opposite mount face 5b of the printed board 5, the part being in contact with the thermally conductive material 29. The thermally conductive thin film layer 17c, which is formed inside the printed board 5 so as to correspond to the position of the thermally conductive thin film layer 17b, is also formed to have a similar shape to the projected shape of the electronic component 3.

b) In this Embodiment 1, the thermally conductive thin film layers 17 are successively placed in a vertical direction in FIG. 1 so as to correspond to the position where the electronic component 3 is mounted. At the same time, the thermally conductive material 29 is placed between the printed board 5 and the protrusion 27 of the cover 13 so as to be pressed therebetween to be in contact therewith. Therefore, the heat generated by the electronic component 3 can be efficiently dissipated to the outside through the cover 13 at a lower cost than in a conventional structure.

Moreover, in this Embodiment 1, since the printed board 5 is pressed by the cover 13 in direct contact therewith so as to be secured thereto, a distance between the printed board 5 and the protrusion 27 of the cover 13, that is, dimensional accuracy of the portion where the thermally conductive material 29 is placed, can be easily ensured. Additionally, since a part of the thermally conductive thin film layers 17a, 17b, and 17c is provided so as to correspond to the position where the electronic component 3 is mounted and the remaining part thereof at the periphery of the mount position are thermally separated from each other, there is an advantage in that the heat is hardly transferred to the periphery through the printed board 5.

Alternatively, an area of the thermally conductive thin film layers 17a, 17b, and 17c on the mount face 5a side of the printed board 5 may be larger than that on the opposite mount face 5b side. As a result, the heat dissipation properties are further improved. Instead of bringing the printed board 5 and the cover 13 in direct contact with each other, a spacer having a predetermined thickness may alternatively be placed between the printed board 5 and the cover 13. As a result, it is possible to adjust a space therebetween.

(Embodiment 2)

Next, an electronic control unit of Embodiment 2 will be described. Descriptions similar to that of the above-described Embodiment 1 will be omitted.

a) An electronic control unit of Embodiment 2 will be described with reference to FIG. 2.

Figure 2:
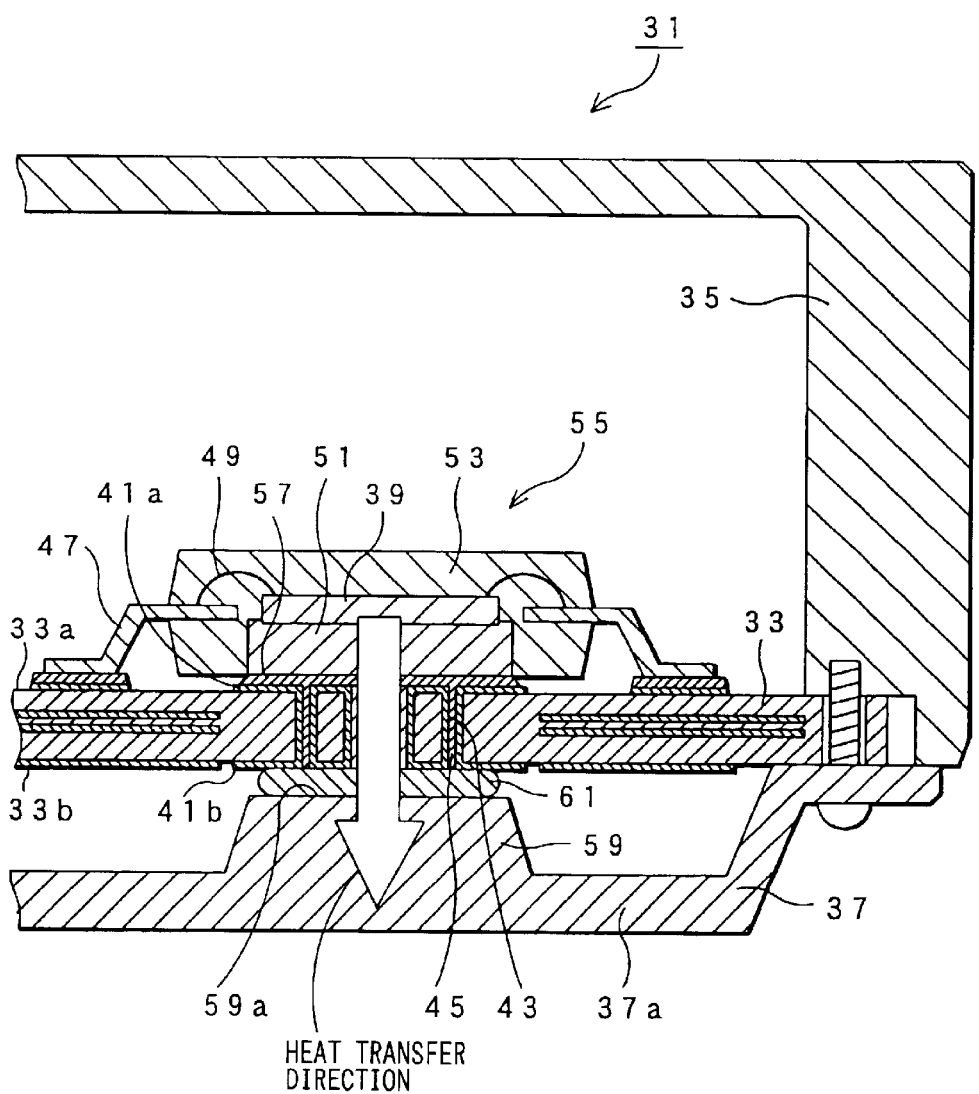
FIG. 2 is a cross-sectional view showing an electronic control unit of Embodiment 2.

As shown in FIG. 2, also in an electronic control unit (ECU) 31, a printed board 33 is interposed between a case 35 and a cover 37 so as to be fixed therebetween, in a similar manner to that of the above-described Embodiment 1. Thermally conductive thin film layers 41a and 41b, each having a similar shape to that obtained by projecting an electronic component 39, are respectively formed on a mount face 33a and an opposite mount face 33b of the printed board 33. At the same time, holes 43 are formed through the printed board 33 so as to connect the thermally conductive thin film layers 41a and 41b on both sides to each other.

A copper foil is formed on an inner peripheral face of each of the through holes 43. Each of the through holes 43 is filled with a solder 45. The thermally conductive thin film layers 41a and 41b are formed so as to overlap a region obtained by projecting the electronic component 39 onto the printed board 33 side (that is, so as to be larger than a region obtained by the projection).

The electronic component 39 is molded along with a lead frame 47, a bonding wire 49 and a radiator member (a radiator fin or a heat sink) 51 through a resin 53. This molded component (hereinafter, also indicated by the reference numeral 55) 55 is bonded to the thermally conductive thin film layer 41a on the mount face 33a of the printed board 33 through the radiator member 51 with a solder 57.

A protrusion 59, which protrudes from a bottom part 37a of the cover 37 toward the position where the electronic component 39 is mounted, is provided on the cover 37. The protrusion 59 is integrally formed with the cover 37 in a solid form.

Also in this embodiment, a flexible semi-solid thermally conductive material 61 is placed between an end face 59a of the protrusion 59 and the opposite mount face 33b of the printed board 33 (corresponding to the position where the electronic component 39 is mounted) so as to be in contact with the end face 59a and the opposite mount face 33b.

b) This Embodiment 2 has a similar effect to that of the above-described Embodiment 1. In particular, since the through holes 43 are formed so as to connect the thermally conductive thin film layers 41a and 41b on the mount face 33a and the opposite mount face 33b to each other, this embodiment is effective in that the heat dissipating ability is further improved. Thus, this embodiment is suitable for an electronic component having a relatively large amount of heat generation.

(Embodiment 3)

Next, an electronic control unit of Embodiment 3 will be described. Descriptions that are the same as in the above-described Embodiment 2 will be herein omitted.

a) An electronic control unit of Embodiment 3 will be described with reference to FIG. 3.

Figure 3:
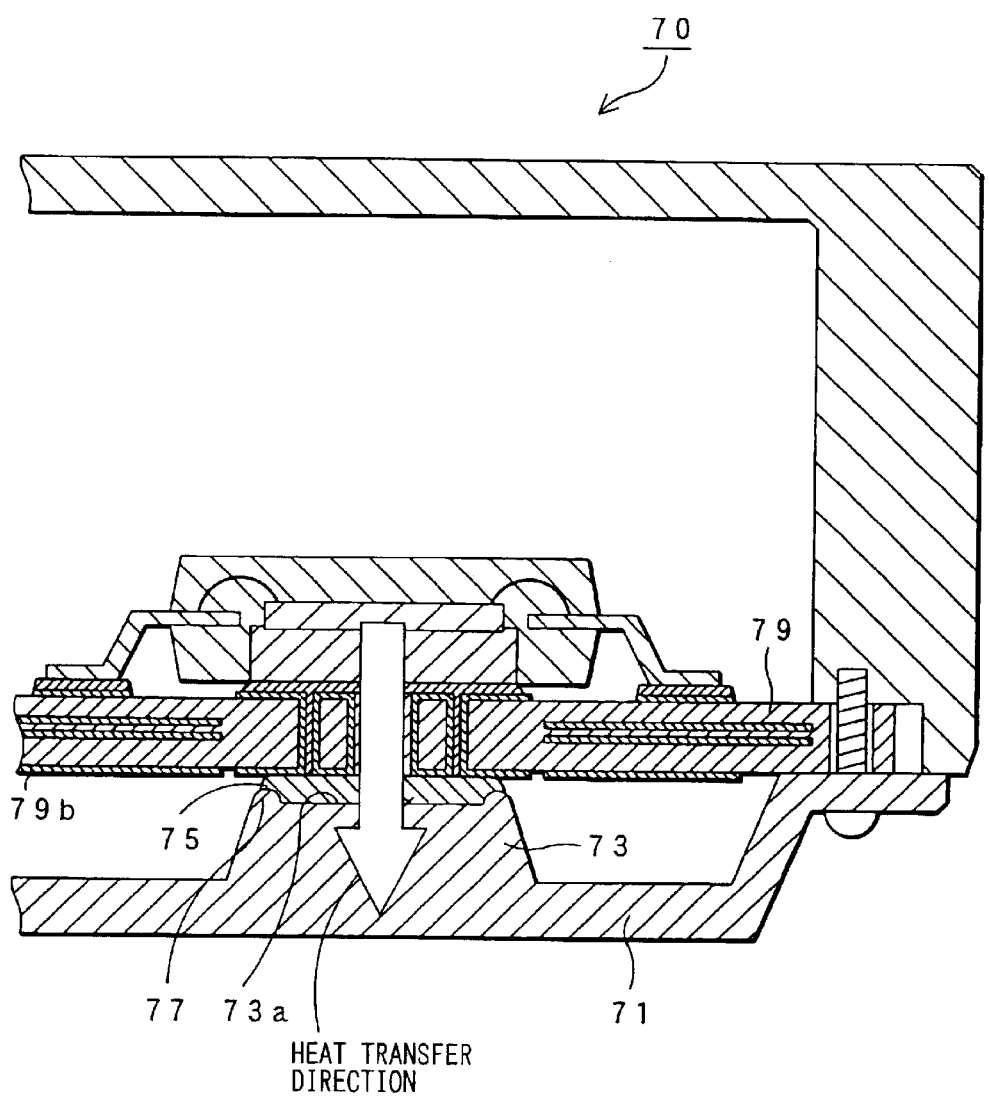
FIG. 3 is a cross-sectional view showing an electronic control unit of Embodiment 3.

As shown in FIG. 3, a fundamental structure of an electronic control unit 70 of Embodiment 3 is similar to that of the above-described Embodiment 2.

Figure 4A:
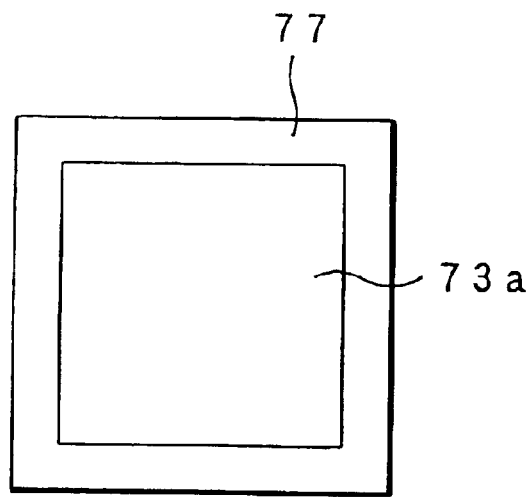
FIGS. 4A and 4B are plan views, each showing a movement-stopping part of the electronic control unit of Embodiment 3.

However, in this embodiment, a convex-shaped movement-stopping part (movement-stopping frame part) 77 for preventing a thermally conductive material 75 from flowing out to the periphery is provided on an end face 73a of a protrusion 73 of a cover 71. This movement-stopping part 77 is formed to have a rectangular frame-like shape so as to surround the periphery of the end face 73a of the protrusion 73, as shown in FIG. 4A which illustrates a plan view thereof. As shown in FIG. 3, the movement-stopping part 77 protrudes from the end face 73a toward the opposite mount face 79b side of the printed board 79. The movement-stopping part 77 is integrally formed with the protrusion 73 and thus, with the cover 71.

b) This Embodiment 3 produces a similar effect to that of the above-described Embodiment 2. At the same time, since the frame-like movement-stopping part 77 is formed on the end face 73a, the thermally conductive material 75 can be effectively prevented from flowing out. Furthermore, since the movement-stopping part 77 is integrally formed with the protrusion 73, there is an advantage in that the formation of the movement-stopping part 77 is facilitated.

Figure 4B:
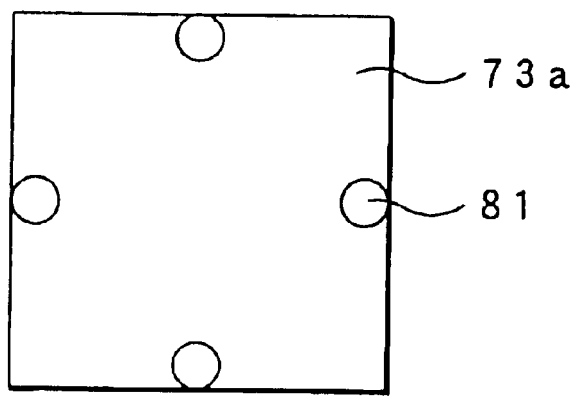

In the case where the thermally conductive material 75 is not highly fluid, for example, as in the case of a sheet-like one, convex portions 81 may be partially provided, for example, at the periphery of the end face 73a of the protrusion 73 as shown in FIG. 4B. Moreover, instead of providing the movement-stopping part 77 on the protrusion 73 side, a movement-stopping part having a similar shape to that shown in FIG. 4B may be provided by, for example, soldering, on the opposite mount face 79b on the printed board 79.

(Embodiment 4)

Next, an electronic control unit of the fourth Embodiment will be described. Descriptions that are the same as those of Embodiment 3 will be herein omitted.

a) An electronic control unit of Embodiment 4 will be described based on FIG. 5.

Figure 5:
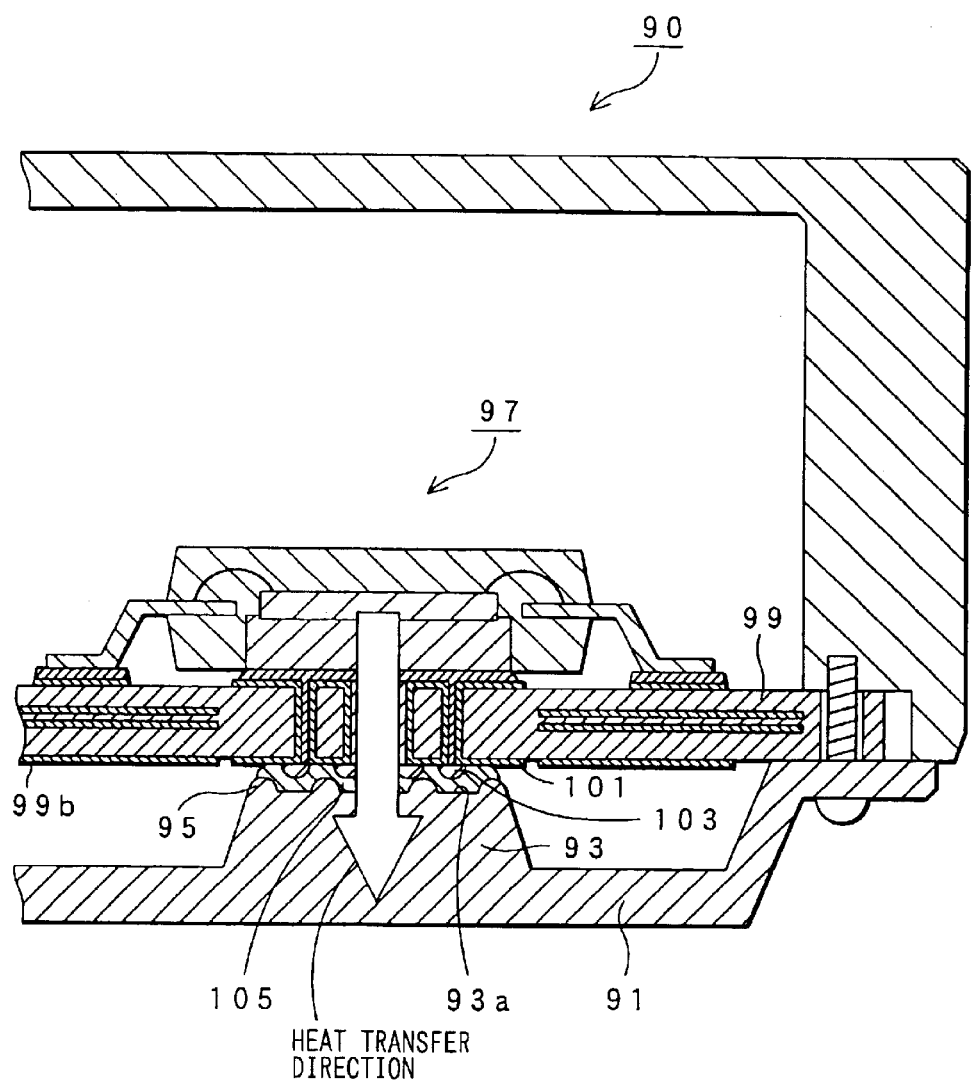
FIG. 5 is a cross-sectional view showing an electronic control unit of Embodiment 4.

As shown in FIG. 5, the fundamental structure of the electronic control unit 90 of Embodiment 4 is similar to that of the above-described Embodiment 3. In this embodiment, in particular, a large number of convex portions 95 are provided on an end face 93a of a protrusion 93 of a cover 91, so that the end face 93a in a convex-concave shape is formed. Simultaneously, a large number of convex portions 103 are similarly provided on a thermally conductive thin film layer 101 formed on an opposite mount face 99b of a printed board 99 (the thermally conductive thin film layer 101 being provided so as to correspond to the position where a molded component 97 is mounted), so that a surface of the thermally conductive thin film layer 101 has a convex-concave shape.

The surfaces of the end face 93a and the thermally conductive thin film layer 101 are shaped so that the convex and concave portions on the end face 93a of the protrusion 93 correspond to those of the thermally conductive thin film layer 101.

A thermally conductive material 105 is placed between the concave-convex shaped end face 93a of the protrusion 93 and the concave-convex shaped thermally conductive thin film layer 101, resulting in a meandering cross-sectional shape of the thermally conductive material 105. However, a thickness of the thermally conductive material 105 is approximately uniform.

The convex portions 95 of the protrusion 93 are integrally formed with the protrusion 93 (thus with the cover 91), whereas the convex portions 103 on the opposite mount face 99b side of the printed board 99 are formed by soldering.

b) This Embodiment 4 also produces a similar effect to that of the above-described Embodiment 3. At the same time, since the thermally conductive material 105 is interposed between the concave-convex shaped end face 93a of the protrusion 93 and the concave-convex shaped thermally conductive thin film layer 101 to form a large contact area therebetween, this embodiment is effective in that even higher heat dissipation properties can be obtained than a design that is not concave-convex shaped.

Since the convex-concave portions on the end face 93a of the protrusion 93 and the convex-concave portions on the thermally conductive thin film layer 101 fit each other to create a uniform distance between the convex-concave surface of the end face 93a of the protrusion 93 and that of the thermally conductive thin film layer 101, the heat transfer is also uniform. Therefore, such a structure is effective in that even a minimum of thermally conductive material 105 offers the maximum in heat dissipation properties. Moreover, since only a small amount of the thermally conductive material 105 is necessary, a cost reduction is also realized.

(Embodiment 5)

Figure 6:
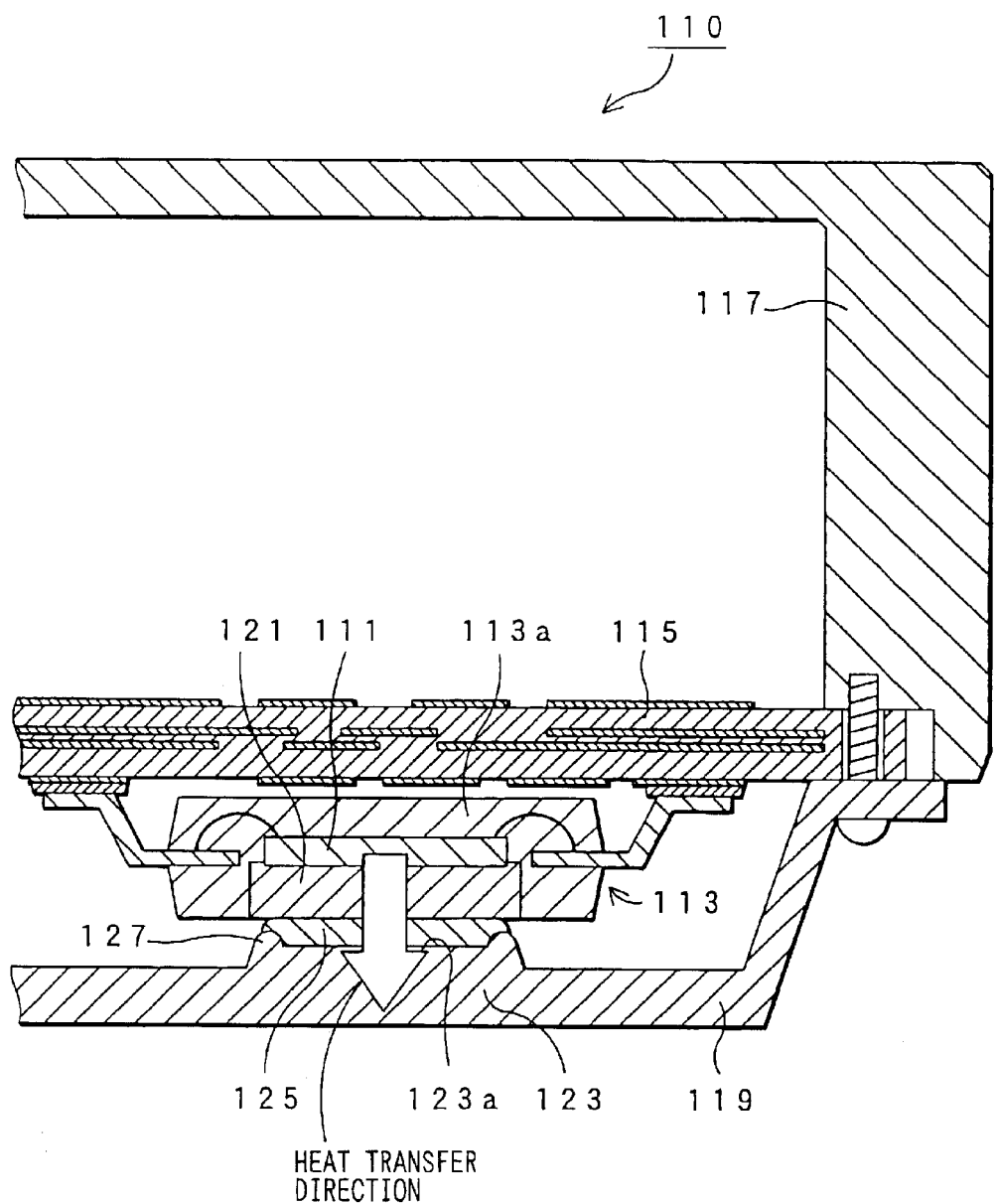
FIG. 6 is a cross-sectional view showing an electronic control unit of Embodiment 5.

Next, an electronic control unit of Embodiment 5 will be described. Descriptions similar to those of Embodiment 3 will be herein omitted.

a) An electronic control unit of Embodiment 5 will be described with reference to FIG. 6. As shown in FIG. 6, an electronic control unit 110 differs from that of the above Embodiment 3 in that a main body part 113a of a molded component 113 housing an electronic component 111 therein is not in contact with a printed board 115 and in that the printed board 115 does not have any through holes.

More specifically in this embodiment, the molded component 113 is placed not on a case 117 side but on a cover 119 side. Moreover, a radiator member 121 is placed not on the printed board 115 side, but on the cover 119 side. A thermally conductive material 125 is placed between the radiator member 121 and a protrusion 123 of the cover 119.

A frame-like movement-stopping part 127 as described above is formed on an end face 123a of the protrusion 123 of the cover 119.

b) In this embodiment, the molded component 113 is placed in a reverse position with respect to Embodiments 1 to 4 described above. Since the main body part 113a of the molded component 113 is not in direct contact with the printed board 115, the heat is minimally transferred to the printed board 115 side, thereby providing even higher heat dissipation properties.

Moreover, the movement-stopping part 127 can prevent the thermally conductive material 125 from flowing out. Although the movement-stopping part 127 is provided on the protrusion 123 side in this embodiment, a similar movement-stopping part may also be provided on the radiator member 121 side.

(Embodiment 6)

Figure 7:
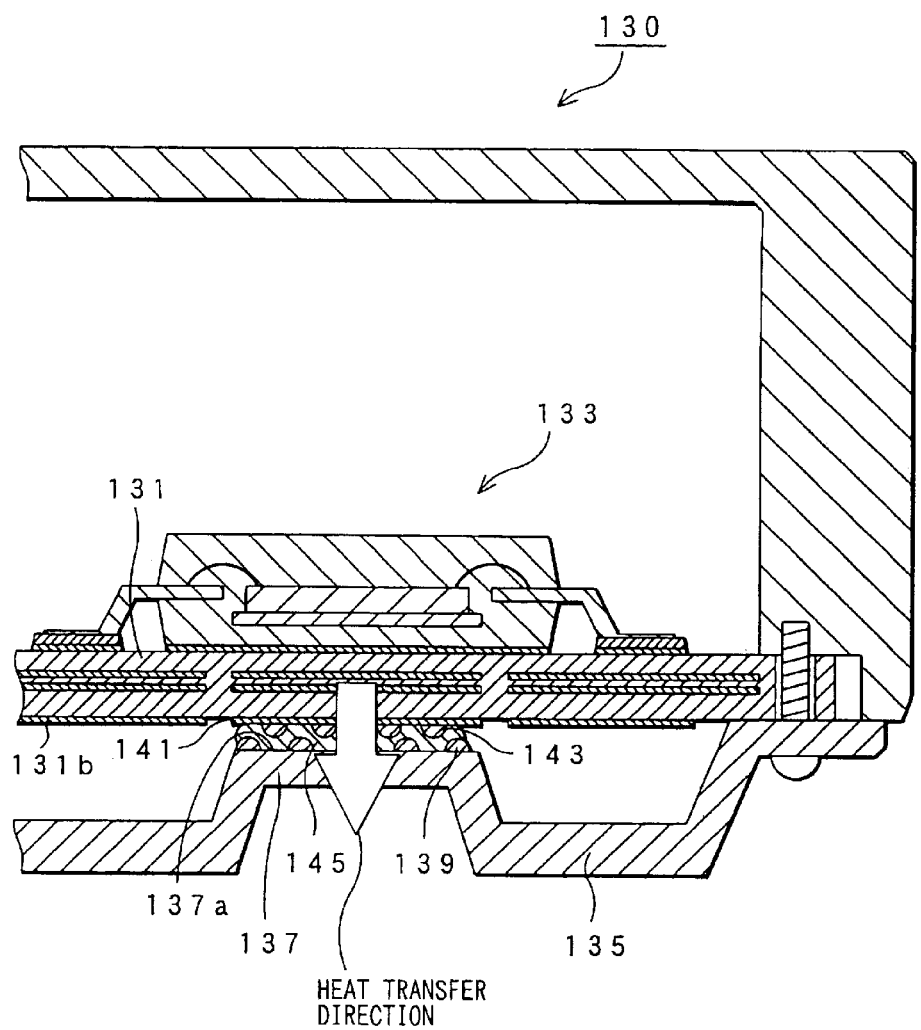
FIG. 7 is a cross-sectional view showing an electronic control unit of Embodiment 6.

Next, an electronic control unit of Embodiment 6 will be described. Descriptions similar to that of Embodiment 1 described above will be herein omitted.

a) An electronic control unit of Embodiment 6 will be described with reference to FIG. 7. As shown in FIG. 7, an electronic control unit 130 of Embodiment 6 includes a printed board 131, a molded component 133 and a cover 135 (formed by pressing), similar to those of the above-described Embodiment 1.

As in the above-described Embodiment 4, in this embodiment, a number of convex portions 139 are provided on an end face 137a of a protrusion 137 of the cover 135 so as to form the convex-concave shaped end face 137a. At the same time, a number of convex portions 143 are similarly provided on a thermally conductive thin film layer 141 on an opposite mount face 131b of the printed board 131 so as to provide a convex-concave shaped surface for the thermally conductive thin film layer 141.

Moreover, the convex-concave portions on the end face 137a of the protrusion 137 and those on the thermally conductive thin film layer 141 are formed so as to correspond to each other. A thermally conductive material 145 is placed between the convex-concave shaped end face 137a of the protrusion 137 and the convex-concave shaped surface of the thermally conductive thin film layer 141.

The convex portions 139 on the protrusion 137 are integrally formed with the protrusion 137 (thus with the cover 135), whereas the convex portions 143 on the opposite mount face 131b side of the printed board 131 are formed by soldering.

b) This embodiment also produces a similar effect to that of the above-described Embodiment 4. In addition, the convex portions 139 on the protrusion 137 are integrally formed with the protrusion 137 (and thus with the cover 135), whereas the convex portions 143 on the opposite mount face 131b side of the printed board 131 are formed by soldering. Therefore, both of the convex portions 139 and 143 are formed only with original material. More specifically, this embodiment is effective in that the heat dissipation properties can be improved without requiring any additional cost.

(Embodiment 7)

Figure 8:
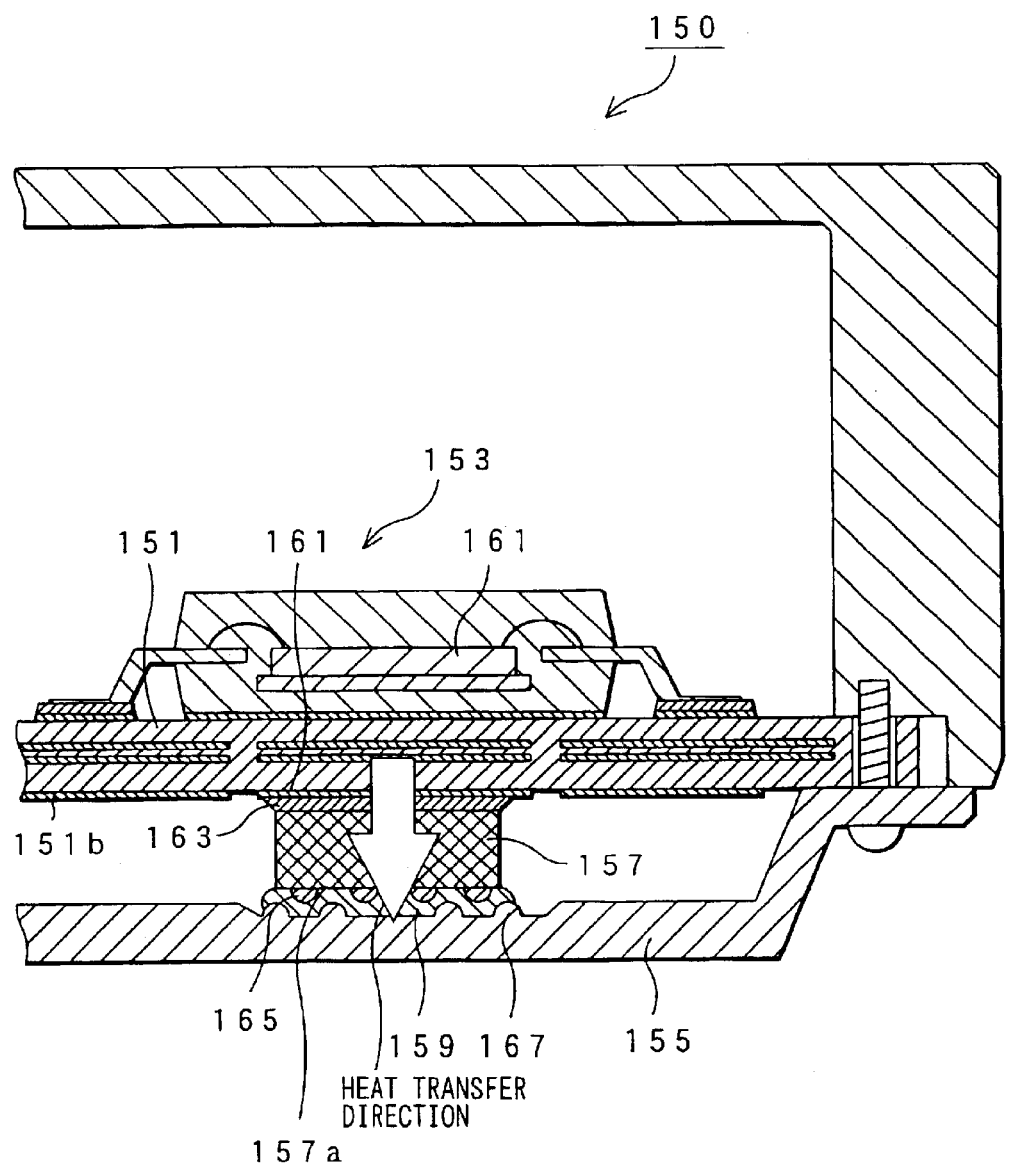
FIG. 8 is a cross-sectional view showing an electronic control unit of Embodiment 7.

Next, an electronic control unit of Embodiment 7 will be described. Descriptions that are the same as those of Embodiment 1 described above will be herein omitted.

a) An electronic control unit of Embodiment 7 will be described with reference to FIG. 8. As shown in FIG. 8, an electronic control unit 150 of Embodiment 7 includes a printed board 151, a molded component 153 and the like, similar to those of the above-described Embodiment 1.

In particular, in this embodiment, no protrusion is formed on the cover 155. A thermally conductive member 157 serving as a solid surface mount device (SMD) is placed between the cover 155 and an opposite mount face 151b of the printed board 151, whereas a thermally conductive material 159 is placed between the thermally conductive member 157 and the cover 155.

The thermally conductive member 157 is bonded onto a thermally conductive thin film layer 161 formed on the opposite mount face 151b of the printed board 151 (so as to correspond to the position where an electronic component 161 is mounted) with a solder 163. Moreover, a number of convex portions 165 are provided on an end face 157a on the cover 155 side so as to form the convex-concave shaped end face 157a.

On the other hand, a number of convex portions 167 are similarly provided on a surface of the cover 155 opposed to the thermally conductive member 157 so as to form a convex-concave shaped surface of the cover 155. The convex portions 165 of the thermally conductive member 157 are integrally formed with the thermally conductive member 157 (or formed by soldering). The convex portions 167 on the cover 155 side are also integrally formed with the cover 155.

b) This Embodiment 7 has a similar effect to that of the above-described Embodiment 1. Moreover, since the thermally conductive material 159 is interposed vertically between the convex-concave shaped surfaces, heat can be effectively transferred from the thermally conductive member 157 to the cover 155 side. As a result, heating of peripheral components can be minimized.

Furthermore, since the thermally conductive material 159 is interposed vertically between the convex-concave shaped surfaces, this embodiment is advantageous because it exhibits excellent heat dissipation properties and the like as in the above-described Embodiment 4.

(Embodiment 8)

Figure 9:
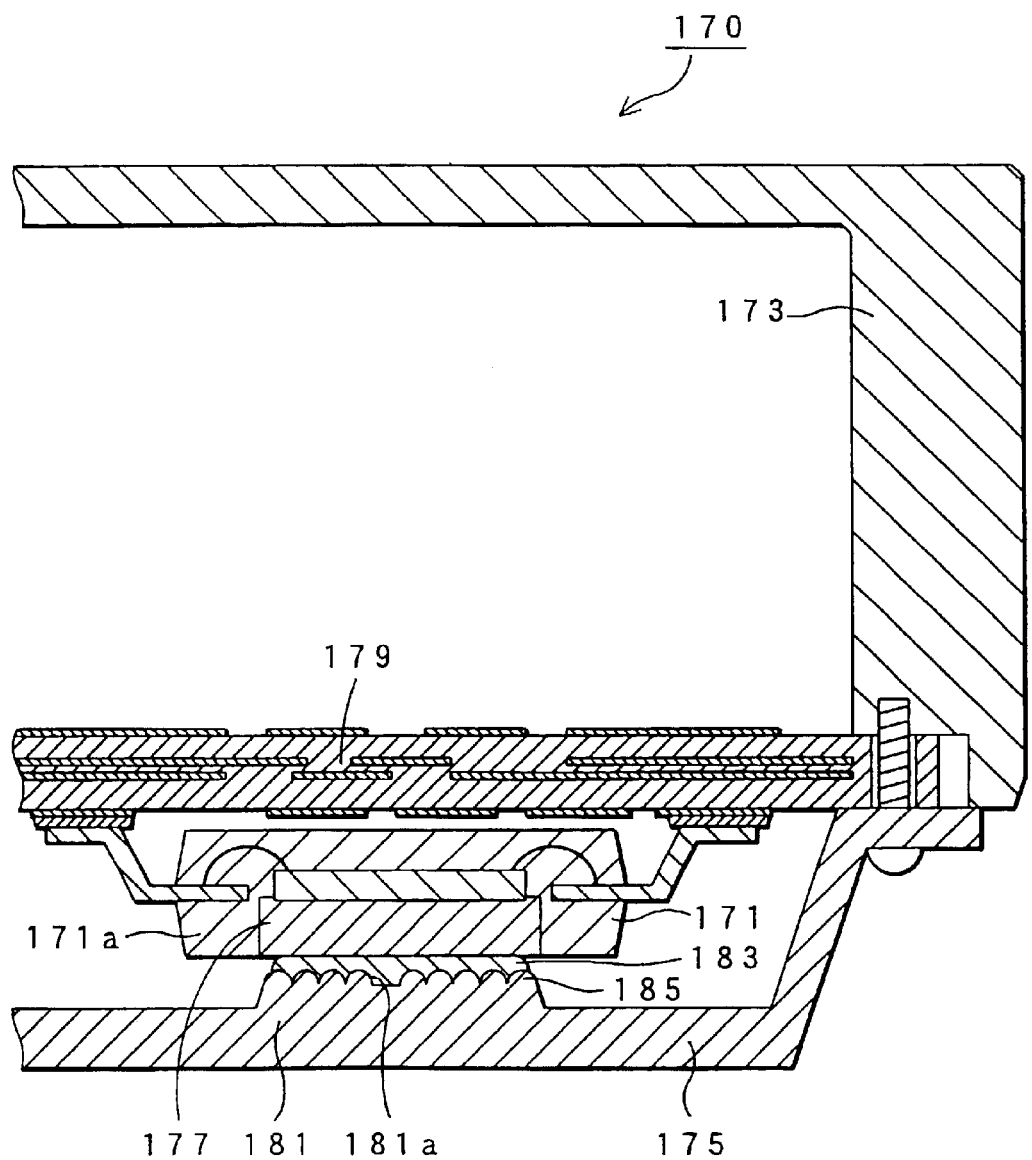
FIG. 9 is a cross-sectional view showing an electronic control unit of Embodiment 8.

Next, an electronic control unit of Embodiment 8 will be described. Descriptions that are the same as those of Embodiment 5 described above will be herein omitted.

a) First, an electronic control unit of Embodiment 8 will be described with reference to FIG. 9. As shown in FIG. 9, in an electronic control unit 170 of this embodiment, a molded component 171 is placed not on a case 173 side but on a cover 175 side, as in the above-described Embodiment 5.

More specifically, in this embodiment, a radiator member 177 is placed not on a printed board 179 side but on the cover 175 side. A thermally conductive material 183 is placed between the radiator member 177 and a protrusion 181 of the cover 175. In particular, in this embodiment, a plurality of convex portions 185 are provided on an end face 181a of the protrusion 181 of the cover 175, so that the end face 181a has a convex-concave shape.

The convex portions 185 are integrally formed with the cover 175.

b) Similarly to the above-described Embodiment 5, a main body part 171a of the molded component 171 is not in direct contact with the printed board 179 in this embodiment. Therefore, the heat is minimally transferred to the printed board 179 side, resulting in further higher heat dissipation properties. Since a number of convex portions 185 are formed on the end face 181a of the protrusion 181 to provide a large contact area, this structure is advantageous in its high heat radiating efficiency. Although the convex portions 185 are provided on the protrusion 181 side, a number of similar convex portions may be provided on the radiator member 177 side.

(Embodiment 9)

Figure 10:
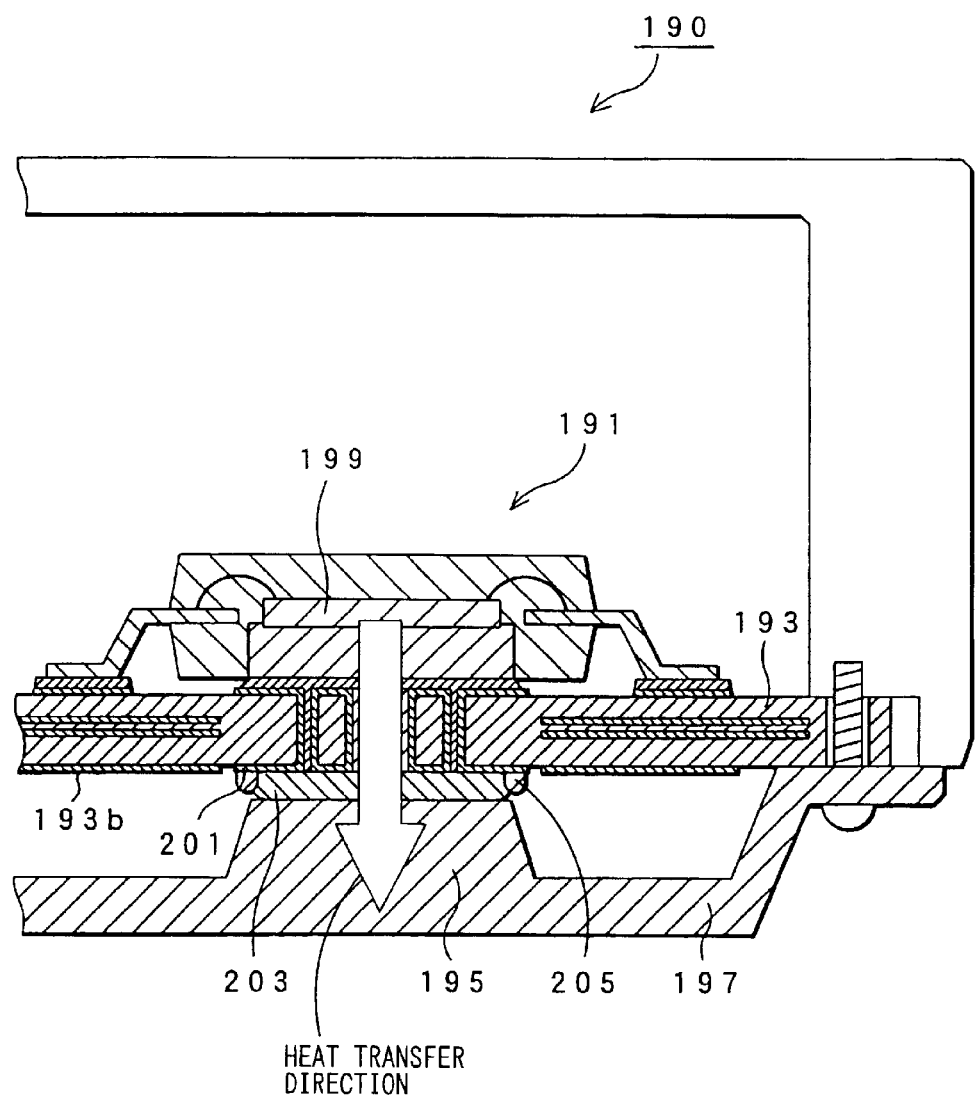
FIG. 10 is a cross-sectional view showing an electronic control unit of Embodiment 9.

Next, an electronic control unit of Embodiment 9 will be described. Descriptions that are the same as that of Embodiment 4 described above will be herein omitted.

a) An electronic control unit of Embodiment 9 will be first described with reference to FIG. 10. As shown in FIG. 10, an electronic control unit 190 of this embodiment includes a molded component 191, a printed board 193, and a cover 197 (having a protrusion 195), which are similar to those of the above-described Embodiment 4.

In this embodiment, in particular, a thermally conductive thin film layer 201 is formed on an opposite mount face 193b side of the printed board 193 (so as to be opposed to the position where an electronic component 199 is mounted), while a movement-stopping part 205 projecting toward the protrusion 195 of the cover 197 is provided so as to surround the outer periphery of a thermally conductive material 203. The movement-stopping part 205, which is made of a solder, is formed in a rectangular frame-like shape along the outer periphery of the thermally conductive thin film layer 201 (thus, having the same shape as that of the outer periphery of the protrusion 195).

b) Since the movement-stopping part 205 is formed at the periphery of the thermally conductive material 203 in this embodiment, the thermally conductive material 203 can be prevented from flowing out.

More specifically, in the case where a viscous semi-fluid thermally conductive material is used as the thermally conductive material 203, it is not necessary to thinly apply the thermally conductive material 203. Instead, for example, it is sufficient to use a rather larger amount of the thermally conductive material 203, compared to the volume of a space where the thermally conductive material 203 is to be placed, so as to join the printed board 193 and the cover 197 to each other. Thus, in the case of this combination, an excessive part of the thermally conductive material 203 is pushed away after the thermally conductive material fills the area surrounded by the movement-stopping part, prior to flowing out to the exterior area. Therefore, such a combination allows the application of the thermally conductive material to be ensured with a simple operation.

Furthermore, even in the case where the electronic control unit 190 is longitudinally placed, the thermally conductive material 203 does not flow out because the movement-stopping part 205 prevents the thermally conductive material 203 from moving as well as flowing out.

(Embodiment 10)

Figure 11:
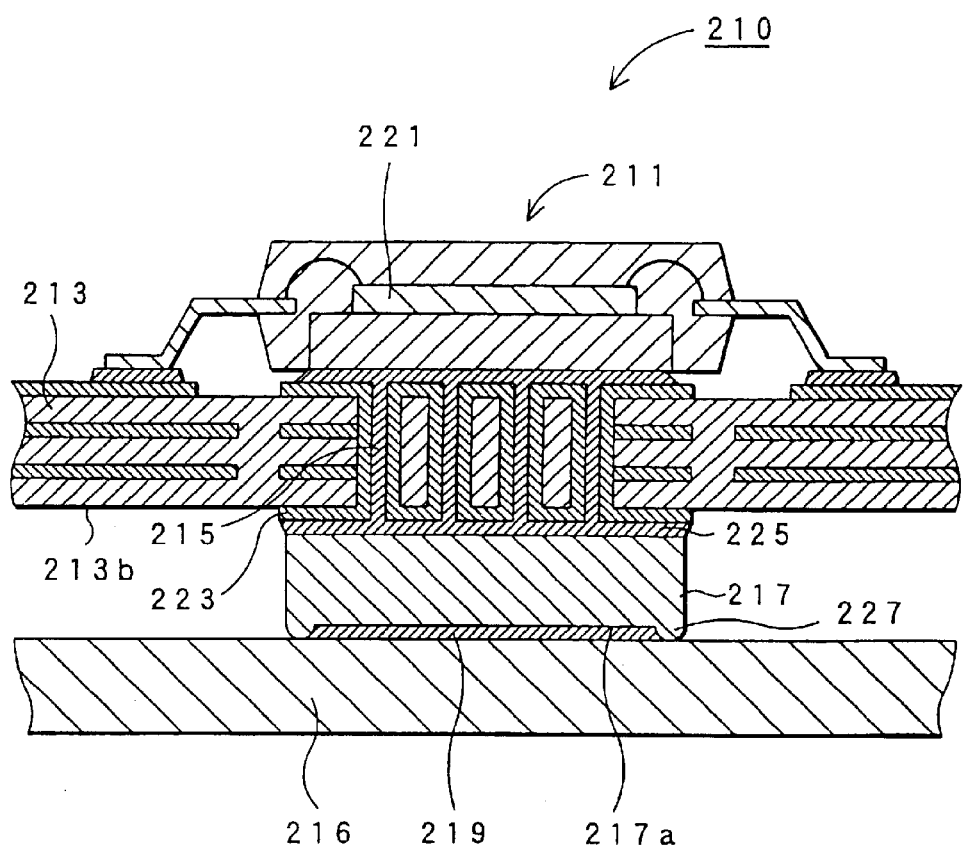
FIG. 11 is a cross-sectional view showing an electronic control unit of Embodiment 10.
Figure 12:
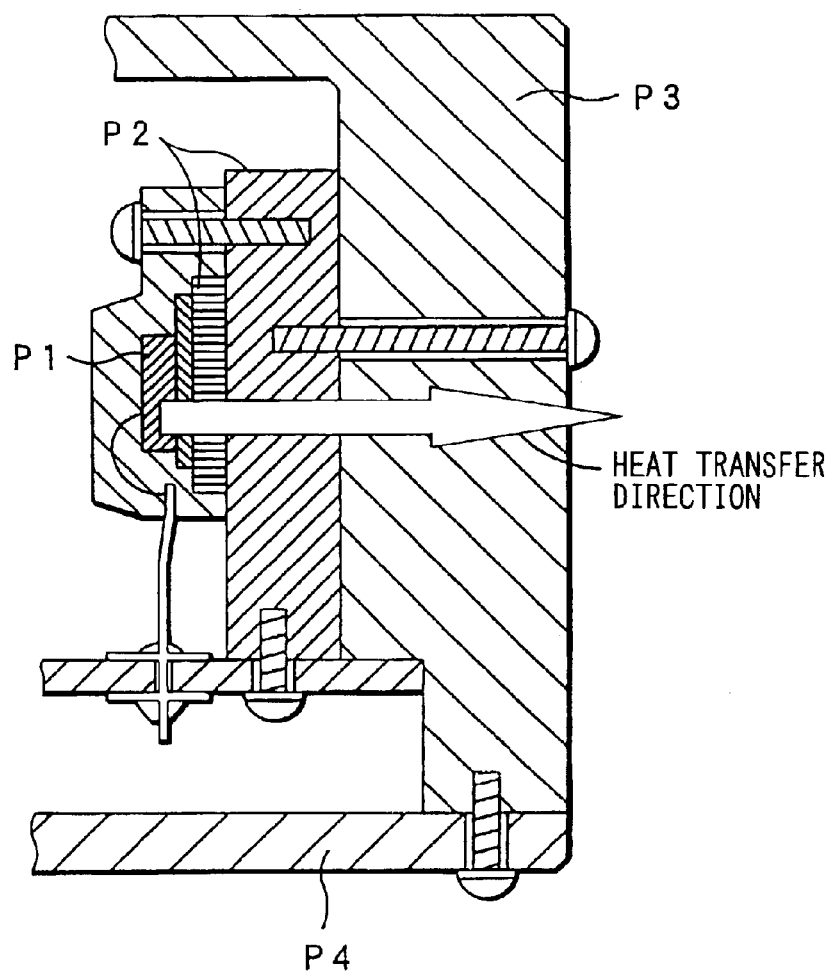
FIG. 12 is a cross-sectional view showing an electronic control unit of the prior art.
Figure 13:
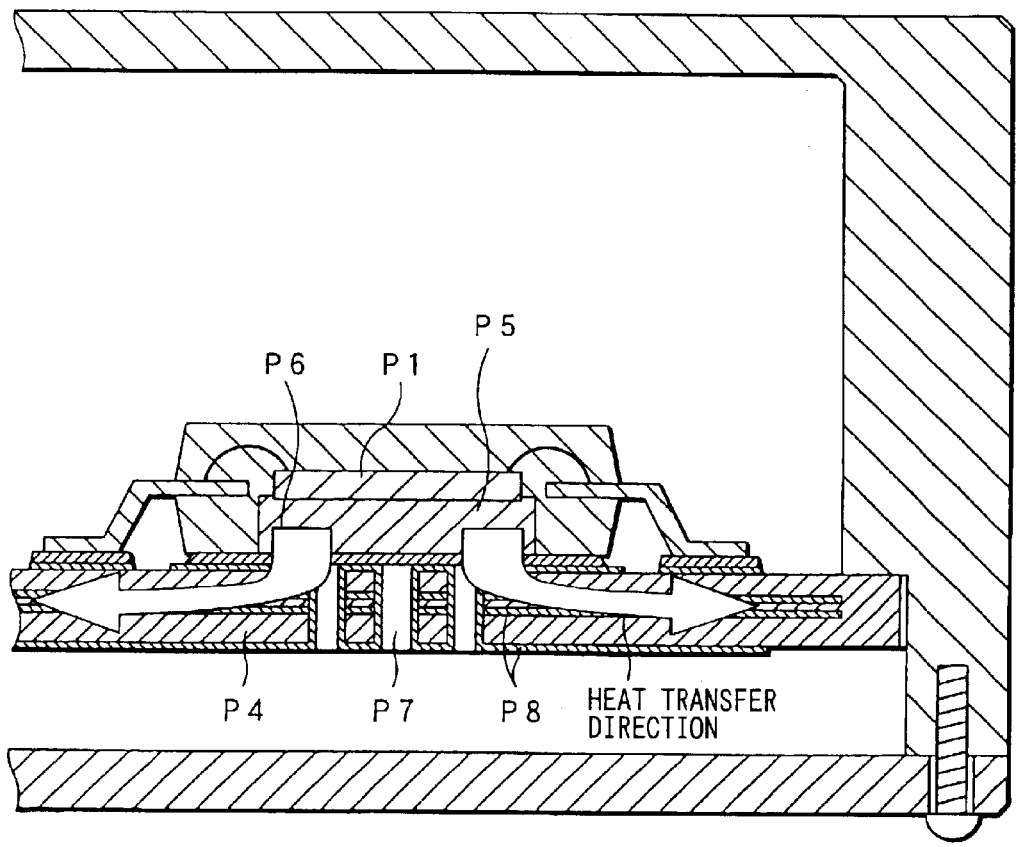
FIG. 13 is a cross-sectional view showing an electronic control unit of the prior art.

Next, an electronic control unit of Embodiment 10 will be described. Descriptions the same as that of Embodiment 7 described above will be herein omitted.

a) An electronic control unit of Embodiment 10 will be first described with reference to FIG. 11. As shown in FIG. 11, an electronic control unit 210 of this embodiment includes a molded component 211, a printed board 213, and the like, which are substantially the same as those of the above-described Embodiment 7. This embodiment differs from Embodiment 7 in that through holes 215 are provided through the printed board 213.

In this embodiment, no protrusion is formed on a cover 216. Moreover, a thermally conductive member 217 serving as a solid surface mount device (SMD) is placed between the cover 216 and an opposite mount face 213b of the printed board 213, whereas a thermally conductive material 219 is placed between the thermally conductive member 217 and the cover 216. The thermally conductive member 217 is bonded onto a thermally conductive thin film layer 223 formed on the opposite mount face 213b of the printed board 213 (so as to correspond to the position where the electronic component 221 is mounted) through a solder 225. Moreover, a movement-stopping part 227 is provided on an end face 217a of the thermally conductive member 217 so as to surround the periphery of the thermally conductive material 219.

The movement-stopping part 227 is a convex portion, which is formed in a frame-like shape along the periphery of the thermally conductive member 217 so as to project from the thermally conductive member 217 side toward the cover 216 side. The movement-stopping part 227 is integrally formed with the thermally conductive member 217.

b) The placement of the thermally conductive member 217 allows high heat radiating characteristics to be obtained in this embodiment, as in the above-described Embodiment 7. In particular, in this embodiment, since the movement-stopping part 227 is provided on the thermally conductive member 217 side, the common cover 216 can be used without changing the design of the cover 216 even if the placement of the thermally conductive member 217 is freely changed (that is, the cover 216 can be standardized). Therefore, since the same enclosure can be used for various products, such a structure greatly contributes to a reduction in cost.

Moreover, other than this embodiment, for example, a thermally conductive thin film layer may be provided at a location inside the printed board, corresponding to the position where the electronic component 221 is mounted, without providing any through hole 215. Moreover, the thermally conductive thin film layers on the surfaces of the printed board and inside the printed board may be thermally separated from each other.

The present invention is by no means limited to the above-described embodiments. The present invention can be carried out in various modes without departing from the scope or gist of the present invention. For example, although the enclosure is constituted by the case and the cover in each of the above-described embodiments, a third member other than the case and the cover can be combined therewith. Moreover, the case and the cover may have a similar size.

What is claimed is:

1. An electronic control unit comprising:
   a substrate having a mount face and an opposite mount face;
   an electronic component located on a surface of the mount face, wherein the electronic component generates heat;

a plurality of enclosure members defining an enclosure that houses the substrate, wherein at least one of the plurality of enclosure members is located on a side of the opposite mount face and includes a protrusion that faces toward a position where the electronic component is located; and a flexible, thermally conductive material located between the protrusion and the opposite mount face, wherein the flexible, thermally conductive material is in contact with a surface of the protrusion and a surface of the opposite mount face, wherein the enclosure member having the protrusion and the substrate are in direct contact with each other or are in contact with each other using a spacer that has a predetermined thickness so as to be fixed such that the height of the protrusion differs from the height of a contact area between the enclosure member having the protrusion and the substrate to provide a predetermined clearance between the protrusion and the substrate.

2. The electronic control unit according to claim 1, wherein a thermally conductive thin film layer having a higher thermal conductivity than that of a periphery thereof is provided on the mount face so as to overlap a region obtained by projecting the electronic component thereon.

3. The electronic control unit according to claim 1, wherein a thermally conductive thin film layer having a higher thermal conductivity than that of a periphery thereof is provided on the opposite mount face so as to overlap a region obtained by projecting an end face of the protrusion.

4. The electronic control unit according to claim 1, wherein thermally conductive thin film layers, each having a higher thermal conductivity than that of a periphery thereof, are provided respectively on the mount face and the opposite mount face so as to overlap a region obtained by projecting the electronic component thereon, and the thermally conductive thin film layers are connected to each other through a through hole.

5. The electronic control unit according to claim 1, wherein thermally conductive thin film layers, each having a higher thermal conductivity than that of a periphery thereof, are provided respectively on the mount face, the opposite mount face, and inside the substrate so as to overlap a region obtained by projecting the electronic component thereon.

6. The electronic control unit according to claim 4, wherein an area of the thermally conductive thin film layer on the opposite mount face is larger than that of the thermally conductive thin film layer on the mount face.

7. The electronic control unit according to claim 2, wherein, other than the thermally conductive thin film layer corresponding to the region obtained by projecting the electronic component, a thermally conductive thin film layer is provided at another location of the substrate, and the thermally conductive thin film layers are thermally separated from each other.

8. An electronic control unit comprising:

a substrate having a mount face and an opposite mount face;

an electronic component located on a surface of the mount face, wherein the electronic component generates heat, and wherein the electronic component is molded with a radiator member;

an enclosure for housing the substrate, wherein a part of the enclosure on a side of the opposite mount face has a protrusion facing towards the electronic component; and a flexible, thermally conductive material located between the protrusion and the electronic component and in contact with a surface of the protrusion and a surface of the electronic component, wherein the radiator member contacts the protrusion through the thermally conductive material.

9. The electronic control unit according to claim 8, wherein a surface of the protrusion in contact with the thermally conductive material has a convex-concave shape.

10. The electronic control unit according to claim 9, wherein the convex-concave shape is integrally formed with the enclosure.

11. An electronic control unit comprising:

a substrate having a mount face and an opposite mount face;

an electronic component located on a side of the mount face, wherein the electronic component generates heat; and an enclosure housing the substrate therein, wherein a part of the enclosure on a side of the opposite mount face protrudes toward a position where the electronic component is mounted, a flexible, thermally conductive material is located between the protrusion and the opposite mount face, and at least one surface of the protrusion and the opposite mount face is formed to have a concave-convex shape and the at least one surface is in contact with the thermally conductive material.

12. The electronic control unit according to claim 11, wherein a thermally conductive thin film layer having a higher thermal conductivity than that of a periphery thereof is provided on the opposite mount face, and a convex portion of the convex-concave shape is provided on the thermally conductive thin film layer with a solder.

13. The electronic control unit according to claim 11, wherein the protrusion having the concave-convex shape is integrally formed with the enclosure.

14. The electronic control unit according to claim 11, wherein the convex portion and the concave portion on the opposite mount face are respectively formed so as to correspond to the convex portion and the concave portion on an end face of the protrusion.

15. The electronic control unit according to claim 11, wherein thermally conductive thin film layers, each having a higher thermal conductivity than that of a periphery thereof, are provided on the mount face and the opposite mount face so as to essentially overlap a region obtained by projecting the electronic component thereon, and the thermally conductive thin film layers are connected to each other through a through hole.

16. The electronic control unit according to claim 11, wherein thermally conductive thin film layers, that have a higher thermal conductivity than that of a periphery thereof, are provided on the mount face and the opposite mount face and inside the substrate so as to overlap a region obtained by projecting the electronic component thereon.

17. The electronic control unit according to claim 11, wherein, other than the thermally conductive thin film layer corresponding to the region obtained by projecting the electronic component, a thermally conductive thin film layer is provided at another location of the substrate, and the thermally conductive thin film layers are thermally separated from each other.

18. An electronic control unit comprising:

a substrate having a mount face and an opposite mount face;

an electronic component located on a side of the mount face, wherein the electronic component generates heat;

an enclosure that houses the substrate therein, wherein a part of the enclosure on a side of the opposite mount face protrudes toward a position where the electronic component is mounted;

flexible, thermally conductive material located between the protrusion and the opposite mount face contacts a side of the protrusion and the side of the opposite mount face; and a movement-stopping part that protrudes toward a side of the thermally conductive material, which prevents the thermally conductive material from moving, is provided on at least one surface of the protrusion of the enclosure and the opposite mount face, the at least one surface being in contact with the thermally conductive material.

19. The electronic control unit according to claim 18, wherein a thermally conductive thin film layer having a higher thermal conductivity than that of a periphery thereof is provided on the opposite mount face of the substrate corresponding to the position where the electronic component is mounted, and the movement-stopping part is provided by soldering on a surface of the thermally conductive thin film layer.

20. The electronic control unit according to claim 18, wherein the movement-stopping part is integrally formed with the protrusion.

21. The electronic control unit according to claim 18, wherein the movement-stopping part is a frame part surrounding a periphery of the thermally conductive material and is of a convex shape.

22. An electronic control unit comprising:

a substrate having a mount face and an opposite mount face;

an electronic component located on a side of the mount face, wherein the electronic component generates heat;

an enclosure that houses the substrate therein;

a flexible, thermally conductive material located between a part of the enclosure on the side of the mount face and the electronic component so as to be in contact with a side of the enclosure and a side of the electronic component; and a movement-stopping part that protrudes toward a side of the thermally conductive material, for preventing the thermally conductive material from moving, is provided on at least one surface of the electronic component and the enclosure, wherein the at least one surface is in contact with the thermally conductive material.

23. The electronic control unit according to claim 22, wherein the movement-stopping part is integrally formed with the enclosure.

24. The electronic control unit according to claim 22, wherein the electronic component is in contact with the thermally conductive material through a radiator member that is integrally molded with the electronic component.

25. An electronic control unit comprising:

a substrate having a mount face and an opposite mount face;

an electronic component located on a surface of the mount face, wherein the electronic component generates heat;

a plurality of enclosure members defining an enclosure that houses the substrate, wherein at least one of the plurality of enclosure members located on a side of the opposite mount face includes a protrusion that protrudes toward a position where the electronic component is located; and a flexible, thermally conductive material located between the protrusion and the opposite mount face, wherein the flexible, thermally conductive material is in contact with a surface of the protrusion and a surface of the opposite mount face, wherein the enclosure member having the protrusion and the substrate are in contact with each other or are in contact with other through a spacer that has a predetermined thickness so as to be fixed.

26. An electronic control unit comprising:

a substrate having a mount face and an opposite mount face;

an electronic component located on a side of the mount face, wherein the electronic component generates heat;

an enclosure for housing the substrate, wherein a part of the enclosure on a side of the mount face has a protrusion that protrudes toward the electronic component; and a flexible, thermally conductive material located between the protrusion and the electronic component, wherein the flexible, thermally conductive material is in contact with a surface of the protrusion and a surface of the electronic component, wherein the enclosure member and the substrate are in contact with each other or contact each other through a spacer that has a predetermined thickness so as be fixed.

* * * * *

UNITED STATES PATENT AND TRADEMARK OFFICE
CERTIFICATE OF CORRECTION

PATENT NO.   : 6,816,377 B2
DATED        : November 9, 2004
INVENTOR(S)  : Toru Itabashi It is certified that error appears in the above-identified patent and that said Letters Patent is hereby corrected as shown below:

<u>Title page,</u>
Item [75], Inventors, should read -- Toru Itabashi, Anjo (JP) --

Signed and Sealed this

Third Day of May, 2005

JON W. DUDAS
*Director of the United States Patent and Trademark Office*